(12) United States Patent
Srinivasan et al.

(10) Patent No.: US 12,253,870 B2
(45) Date of Patent: Mar. 18, 2025

(54) VOLTAGE REGULATOR CIRCUIT SYSTEMS AND METHODS

(71) Applicant: Intel Corporation, Santa Clara, CA (US)

(72) Inventors: Archanna Srinivasan, San Jose, CA (US); Ravi Gutala, San Jose, CA (US); Scott Weber, Piedmont, CA (US); Aravind Dasu, Milpitas, CA (US); Mahesh Iyer, Fremont, CA (US); Eriko Nurvitadhi, Beaverton, OR (US)

(73) Assignee: Altera Corporation, San Jose, CA (US)

(*) Notice: Subject to any disclaimer, the term of this patent is extended or adjusted under 35 U.S.C. 154(b) by 761 days.

(21) Appl. No.: 17/352,194

(22) Filed: Jun. 18, 2021

(65) Prior Publication Data

US 2021/0311517 A1    Oct. 7, 2021

(51) Int. Cl.
*G05F 1/575* (2006.01)
*G05F 1/577* (2006.01)
*H01L 25/065* (2023.01)
*H03K 19/00* (2006.01)

(52) U.S. Cl.
CPC .............. *G05F 1/575* (2013.01); *G05F 1/577* (2013.01); *H01L 25/0652* (2013.01); *H03K 19/0016* (2013.01)

(58) Field of Classification Search
CPC ..... G05F 1/575; G05F 1/577; H01L 25/0652; H03K 19/0016
See application file for complete search history.

(56) References Cited

U.S. PATENT DOCUMENTS

| | | | |
|---|---|---|---|
| 8,719,600 B2 | 5/2014 | Gunther et al. | |
| 9,665,115 B2* | 5/2017 | Mathiyalagan | .......... G11C 5/14 |
| 10,345,881 B2 | 7/2019 | Muthukaruppan et al. | |
| 10,403,600 B2* | 9/2019 | Samra | .................. H01L 24/10 |
| 10,833,679 B2 | 11/2020 | Clark et al. | |
| 2005/0040800 A1 | 2/2005 | Sutardja | |
| 2014/0223205 A1 | 8/2014 | Muthukaruppan et al. | |
| 2019/0041923 A1 | 2/2019 | Atsatt et al. | |

(Continued)

OTHER PUBLICATIONS

European Patent Office, Extended European Search Report and European Search Opinion for European patent application 22160259.2 dated Aug. 25, 2022.

*Primary Examiner* — Lincoln D Donovan
*Assistant Examiner* — James G Yeaman
(74) *Attorney, Agent, or Firm* — InventIQ Legal LLP; Steven J. Cahill

(57) ABSTRACT

A circuit system includes a first voltage regulator circuit that generates a first supply voltage for an integrated circuit die based on a first control signal. The first voltage regulator circuit generates a first feedback signal based on the first supply voltage. The circuit system also includes a second voltage regulator circuit that generates a second supply voltage for an integrated circuit die based on a second control signal. The second voltage regulator circuit generates a second feedback signal based on the second supply voltage. The circuit system also includes a third voltage regulator circuit that generates the first control signal based on the first feedback signal and the second control signal based on the second feedback signal. The circuit system may include fully integrated, on-board, and on-package voltage regulator circuits.

22 Claims, 6 Drawing Sheets

(56) References Cited

U.S. PATENT DOCUMENTS

| | | |
|---|---|---|
| 2019/0042127 A1 | 2/2019 | Weber et al. |
| 2019/0043536 A1 | 2/2019 | Weber et al. |
| 2019/0044514 A1 | 2/2019 | Srinivasan et al. |
| 2019/0044515 A1 | 2/2019 | Gutala et al. |
| 2019/0044519 A1 | 2/2019 | Atsatt et al. |
| 2019/0333550 A1* | 10/2019 | Fisch ................ G11C 11/4074 |
| 2020/0119736 A1 | 4/2020 | Weber et al. |

* cited by examiner

VOLTAGE REGULATOR CIRCUIT SYSTEMS AND METHODS

FIELD OF THE DISCLOSURE

The present disclosure relates to electronic circuit systems and methods, and more particularly, to voltage regulator circuit systems and methods for integrated circuits.

BACKGROUND

Many integrated circuit (IC) packages contain multiple integrated circuit dies. Integrated circuit dies in an IC package may, for example, be coupled together through an interposer, an interconnection bridge, or a package substrate. A voltage regulator may provide a supply voltage and supply current to an integrated circuit die in an IC package. The voltage regulator may be on-die, on-board, or on-package.

DETAILED DESCRIPTION

Figure 1:
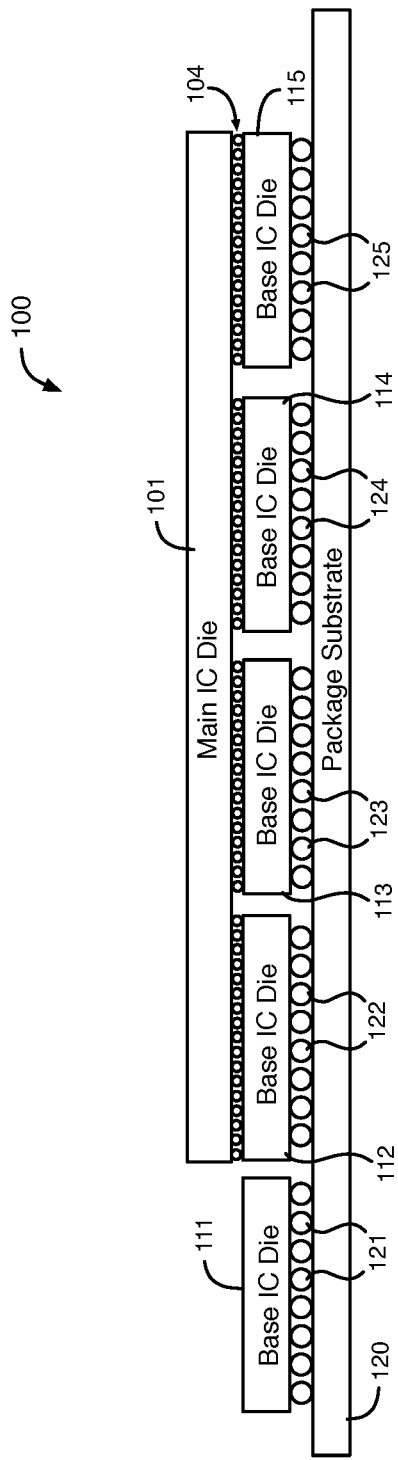
FIG. 1 illustrates a cross section of an exemplary integrated circuit (IC) package having a three dimensional (3D) circuit system that includes a main integrated circuit (IC) die, 5 base IC dies, and a package substrate, according to an embodiment.

In many circuit systems that contain multiple integrated circuit (IC) dies in an IC package, the application requirements of each IC die in the IC package may vary at different times and between IC dies. For example, different IC dies in an IC package may have different performance targets, different frequency targets, and different power consumption targets. In addition, the workload, the performance target, the frequency target, and the power consumption target of each IC die in an IC package may change between applications and over time during the operation of the circuit system. Therefore, each integrated circuit (IC) die in an IC package may need different supply voltages.

According to various embodiments disclosed herein, supply voltages are provided to multiple integrated circuit (IC) dies in a circuit system. The IC dies may, for example, be contained in an IC package or other housing. In some embodiments, a first voltage regulator circuit controls two or more other voltage regulator circuits that provide supply voltages to two or more integrated circuit dies in the circuit system. The first voltage regulator circuit may adjust the supply voltages generated by the other voltage regulator circuits in response to feedback signals from the other voltage regulator circuits. The other voltage regulator circuits may be, for example, fully integrated voltage regulators, on-package voltage regulators, or on-board voltage regulators.

Throughout the specification, and in the claims, the term "connected" means a direct electrical connection between the circuits that are connected, without any intermediary devices. The term "coupled" means either a direct electrical connection between circuits or an indirect connection through one or more passive or active intermediary devices. The term "circuit" may mean one or more passive and/or active electrical components that are arranged to cooperate with one another to provide a desired function.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Figure (FIG.) 1 illustrates a cross section view of an exemplary integrated circuit (IC) package 100 having a three dimensional (3D) circuit system that includes a main integrated circuit (IC) die 101, 5 base IC dies 111-115, and a package substrate 120, according to an embodiment. The main IC die 101 may be any type of IC die, such as a programmable logic IC (e.g., a field programmable gate array (FPGA)), a microprocessor IC, a graphics processing unit (GPU) IC, a memory IC, etc. Base IC dies 111-115 may also be any types of IC dies, such as memory ICs, programmable logic ICs (e.g., FPGAs), microprocessor ICs, GPU ICs, application specific integrated circuits, etc.

The main IC die 101 and the base IC dies 112-115 are vertically stacked and coupled together as shown in FIG. 1 to create a three dimensional (3D) circuit system. The main IC die 101 is coupled to each of the base IC dies 112-115 through connections 104. Base IC dies 112-115 can communicate with main IC die 101 via connections 104. The base IC dies 111-115 are coupled to the package substrate 120 through connections 121-125, respectively. Connections 104 and 121-125 may be, for example, conductive bumps, connections made from thermo compression, or connections made from hybrid bonding. Base IC die 111 can communicate with main IC die 101, for example, via connections 121, conductors in package substrate 120, one or more sets of connections 122-125, through silicon vias (TSVs) in one or more of base IC dies 112-115, and connections 104.

Figure 2:
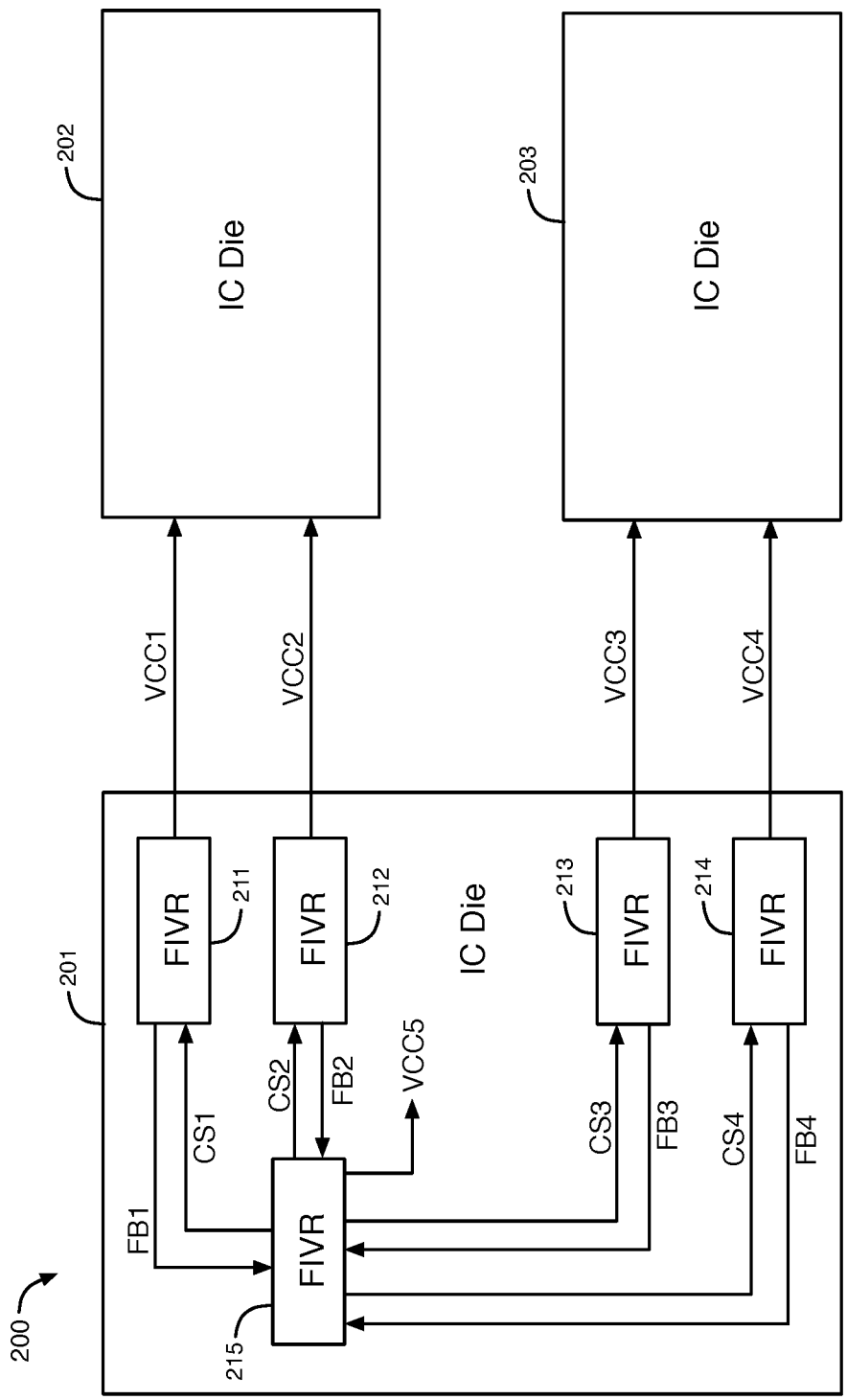
FIG. 2 illustrates an example of a voltage regulation system that generates supply voltages for multiple integrated circuit (IC) dies in a circuit system, according to an embodiment.

FIG. 2 illustrates an example of a voltage regulation system 200 that generates supply voltages for multiple integrated circuit (IC) dies in a circuit system, according to an embodiment. Voltage regulation system 200 includes 3 integrated circuit (IC) dies 201, 202, and 203. The voltage regulation system 200 including the three IC dies 201-203 may, for example, be in a three dimensional (3D) circuit system such as IC package 100 of FIG. 1. IC dies 201-203 may be any of the IC dies 101 and/or 111-115 of FIG. 1. IC dies 201-203 may, for example, be any three of base IC dies 111-115. In an embodiment, one of IC dies 201-203 may be main IC die 101. In other embodiments, IC dies 201-203 may be in another IC package or another type of circuit system. Each of the IC dies 201-203 may be any type of IC die, such as a programmable logic IC (e.g., a field programmable gate array), a microprocessor IC, a GPU IC, a memory IC, an application specific IC, etc.

Voltage regulation system 200 includes 5 fully integrated voltage regulator (FIVR) circuits 211-215. Each of the FIVR circuits 211-215 is fully integrated in IC die 201. 5 FIVR circuits 211-215 are shown in FIG. 2 merely as an example. In other embodiments, IC die 201 may have any number of FIVR circuits that provide supply voltages to any number of IC dies in system 200 or 100. FIVR circuits 211-215 may be any types of voltage regulators, such as, for example, switching voltage regulators or linear voltage regulators. In some embodiments, FIVR circuits 211-215 may be located in main IC die 101 or in any one of the base IC dies 111-115.

Voltage regulator circuits 211, 212, 213, 214, and 215 generate 5 regulated supply voltages VCC1, VCC2, VCC3, VCC4, and VCC5, respectively. Supply voltages VCC1 and VCC2 are provided from voltage regulator circuits 211 and 212, respectively, through power delivery networks (that include conductors in the circuit system) to IC die 202. As examples, supply voltages VCC1-VCC2 may be provided from IC die 201 to IC die 202 through redistribution layers (RDL) in package substrate 120 and/or through silicon vias in one or more of the base IC dies 111-115 to the main IC die 101. Supply voltages VCC1 and VCC2 and supply current from voltage regulator circuits 211-212 are provided through power delivery networks in IC die 202 to circuits (e.g., transistors, resistors, capacitors, and inductors) inside IC die 202.

Supply voltages VCC3 and VCC4 are provided from voltage regulator circuits 213 and 214, respectively, through power delivery networks (that include conductors in the circuit system) to IC die 203. As examples, supply voltages VCC3-VCC4 may be provided from IC die 201 to IC die 203 through redistribution layers (RDL) in package substrate 120 and/or through silicon vias (TSVs) in one or more of the base IC dies 111-115 to the main IC die 101. Supply voltages VCC3 and VCC4 and supply current from voltage regulator circuits 213-214 are provided through power delivery networks in IC die 203 to circuits (e.g., transistors, resistors, capacitors, and inductors) inside IC die 203. Voltage regulator circuit 215 generates a fifth supply voltage VCC5 that is provided through a power delivery network in IC die 201 to circuits (e.g., transistors, resistors, capacitors, and inductors) inside IC die 201.

Voltage regulator circuit 215 controls the operation of the voltage regulator circuits 211-214 using 4 feedback loops shown as arrows in FIG. 2. Voltage regulator circuit 215 generates control signals CS1, CS2, CS3, and CS4 that are provided to voltage regulator circuits 211, 212, 213, and 214, respectively. Control signals CS1, CS2, CS3, and CS4 may be, for example, analog voltages that are provided to voltage regulator circuits 211, 212, 213, and 214, respectively, as input voltages. Voltage regulator circuits 211, 212, 213, and 214 may generate their output supply voltages VCC1, VCC2, VCC3, and VCC4 using current from the analog input voltages CS1, CS2, CS3, and CS4, respectively. As another example, control signals CS1, CS2, CS3, and CS4 may be digital control signals that are used to digitally set and/or adjust the supply voltages VCC1, VCC2, VCC3, and VCC4 generated by the voltage regulator circuits 211, 212, 213, and 214, respectively.

Voltage regulator circuits 211, 212, 213, and 214 generate feedback signals FB1, FB2, FB3, and FB4, respectively. The feedback signals FB1, FB2, FB3, and FB4 are provided to control inputs of voltage regulator circuit 215. The feedback signals FB1, FB2, FB3, and FB4 may indicate the supply voltages VCC1, VCC2, VCC3, and VCC4, respectively.

Alternatively, or in addition to indicating the supply voltages VCC1-VCC4, the feedback signals FB1, FB2, FB3, and FB4 may indicate the supply currents generated by voltage regulator circuits 211, 212, 213, and 214 at their supply outputs that provide supply voltages VCC1-VCC4, respectively.

Voltage regulator circuit 215 may set the control signals CS1, CS2, CS3, and CS4 based on the feedback signals FB1, FB2, FB3, and FB4, respectively, in order to cause the voltage regulator circuits 211, 212, 213, and 214 to set supply voltages VCC1, VCC2, VCC3, and VCC4, respectively, to predetermined voltages. Voltage regulator circuit 215 may adjust the values of the control signals CS1, CS2, CS3, and CS4 based on changes in the values of the feedback signals FB1, FB2, FB3, and FB4 that are caused by changes in the capacitive loads on the power delivery networks in order to cause voltage regulator circuits 211, 212, 213, and 214 to maintain supply voltages VCC1, VCC2, VCC3, and VCC4, respectively, at substantially constant voltages. Thus, voltage regulator circuit 215 uses a feedback control system to maintain supply voltages VCC1-VCC4 at substantially constant and predetermined voltages over variations in the capacitive loads on the power delivery networks that provide supply voltages VCC1-VCC4. Voltage regulator circuit 215 may additionally set and/or adjust the control signals CS1, CS2, CS3, and CS4 based on input signals from other circuitry in IC die 201 or other IC dies to set and/or adjust supply voltages VCC1-VCC4, respectively.

In some exemplary embodiments, voltage regulator circuits 211-215 are fully integrated voltage regulator circuits (FIVRs) that are located in a single field programmable gate array (FPGA) IC die (e.g., any of IC dies 101 or 111-115) for more fine-grained supply voltage control. Design software may have knowledge of the timing criticality of every portion of user logic during optimization of the FPGA to best fit the user logic in the FPGA. The design software can consider the locations of the fine-grained FIVRs in the FPGA when the design software packs logic into the FPGA fabric resources. If the design software packs similar timing critical logic together in the FPGA, the supply voltages of the associated FIVRs can be adjusted to meet the timing requirements of the logic serviced by the FIVRs. Based on timing criticality information from the design software, the design software can adjust the supply voltages of the FIVRs accordingly to reduce power consumption. Particularly, non-critical logic can be driven with a lower supply voltage (determined without making the logic critical—within the slack margin) to reduce power consumption. These features provide workload-dependent voltage control and power reduction.

Figure 3:
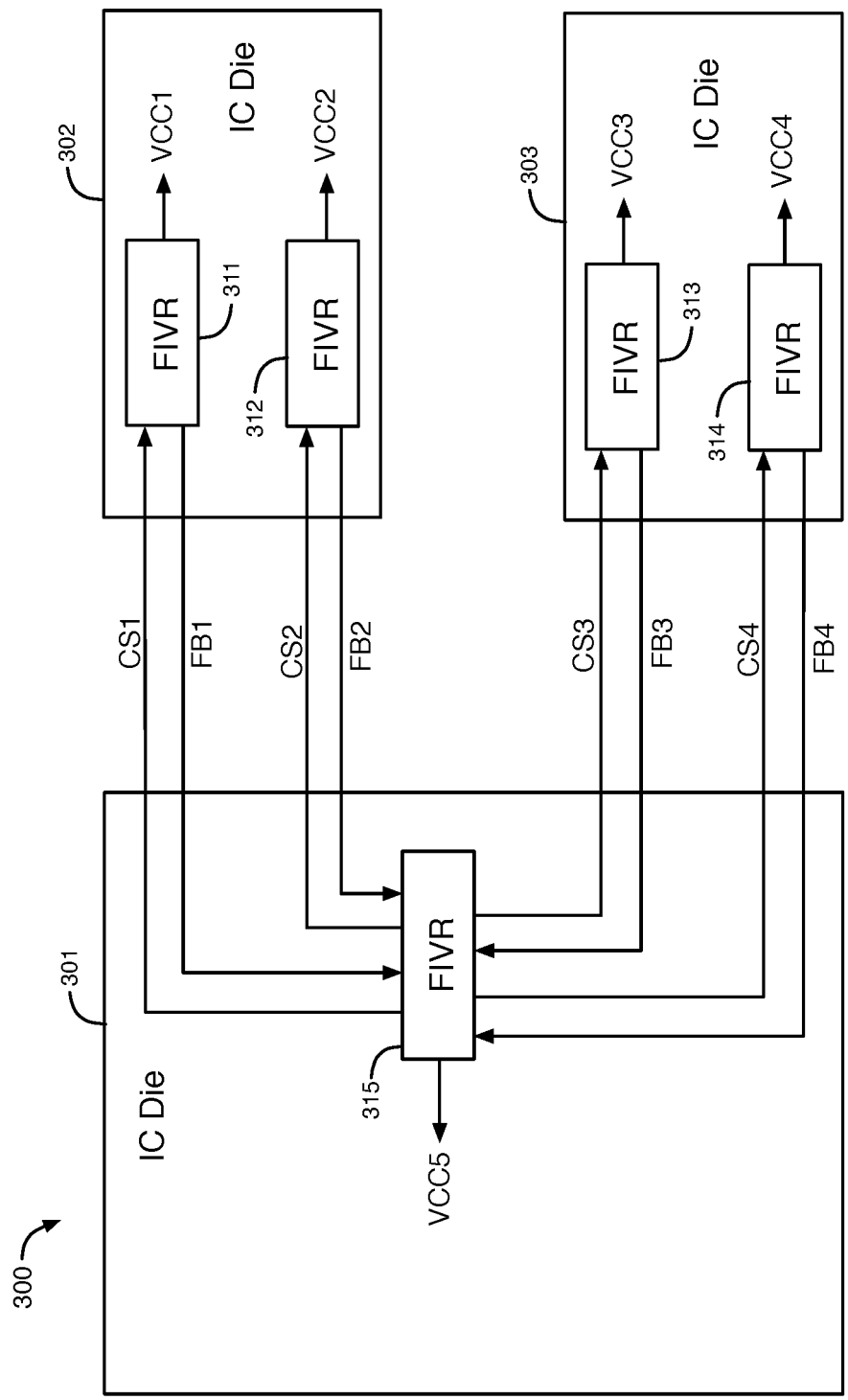
FIG. 3 illustrates another example of a voltage regulation system that generates supply voltages for multiple integrated circuit (IC) dies in a circuit system, according to another embodiment.

FIG. 3 illustrates an example of a voltage regulation system 300 that generates supply voltages for multiple integrated circuit (IC) dies in a circuit system, according to another embodiment. Voltage regulation system 300 includes 3 integrated circuit (IC) dies 301, 302, and 303. The voltage regulation system 300 including the three IC dies 301-303 may, for example, be in a three dimensional (3D) circuit system such as the IC package 100 of FIG. 1. IC dies 301-303 may be any of the IC dies 101 and/or 111-115 of FIG. 1. IC dies 301-303 may, for example, be any three of the base IC dies 111-115. In an embodiment, one of the IC dies 301-303 may be main IC die 101. In other embodiments, IC dies 301-303 may be in another IC package or another type of circuit system. Each of the IC dies 301-303 may be any type of IC die, such as a programmable logic IC (e.g., a field programmable gate array), a microprocessor IC, a GPU IC, a memory IC, an application specific IC, etc.

Voltage regulation system 300 includes 5 fully integrated voltage regulator (FIVR) circuits 311-315. FIVR circuits 311-312 are fully integrated in IC die 302. FIVR circuits 313-314 are fully integrated in IC die 303. FIVR circuit 315 is fully integrated in IC die 301. 5 FIVR circuits 311-315 are shown in FIG. 3 merely as an example. In other embodiments, IC dies 301-303 may have any number of FIVR circuits that provide supply voltages to any number of IC dies in system 300 or 100. Voltage regulator circuits 311-315 may be any types of voltage regulators. In some embodiments, any of voltage regulator circuits 311-315 may be located in main IC die 101 or in any of the base IC dies 111-115.

Voltage regulator circuits 311, 312, 313, 314, and 315 generate 5 regulated supply voltages VCC1, VCC2, VCC3, VCC4, and VCC5, respectively. Supply voltages VCC1 and VCC2 are provided from voltage regulator circuits 311 and 312 through power delivery networks in IC die 302 to circuits (e.g., transistors, resistors, capacitors, and inductors) inside IC die 302. Supply voltages VCC3 and VCC4 are provided from voltage regulator circuits 313 and 314 through power delivery networks in IC die 303 to circuits (e.g., transistors, resistors, capacitors, and inductors) inside IC die 303. Supply voltage VCC5 is provided from voltage regulator circuit 315 through a power delivery network in IC die 301 to circuits inside IC die 301.

Voltage regulator circuit 315 controls the operation of the voltage regulator circuits 311-314 using 4 feedback loops shown as arrows in FIG. 3. Voltage regulator circuit 315 generates control signals CS1, CS2, CS3, and CS4 that are provided to voltage regulator circuits 311, 312, 313, and 314, respectively. Control signals CS1, CS2, CS3, and CS4 may be, for example, analog input voltages or digital control signals that are used by voltage regulator circuits 311-314 to generate supply voltages VCC1, VCC2, VCC3, and VCC4, respectively, as discussed above with respect to FIG. 2.

Voltage regulator circuits 311, 312, 313, and 314 generate feedback signals FB1, FB2, FB3, and FB4, respectively. The feedback signals FB1, FB2, FB3, and FB4 are provided to control inputs of voltage regulator circuit 315. The feedback signals FB1, FB2, FB3, and FB4 may indicate the supply voltages VCC1, VCC2, VCC3, and VCC4 or the supply currents generated by voltage regulator circuits 311, 312, 313, and 314, respectively, at their supply outputs.

Voltage regulator circuit 315 can set the control signals CS1, CS2, CS3, and CS4 based on the feedback signals FB1, FB2, FB3, and FB4, respectively, in order to cause the voltage regulator circuits 311, 312, 313, and 314 to set supply voltages VCC1, VCC2, VCC3, and VCC4, respectively, to predetermined voltages. Voltage regulator circuit 315 can adjust the values of the control signals CS1, CS2, CS3, and CS4 based on changes in the values of feedback signals FB1, FB2, FB3, and FB4 that are caused by changes in the capacitive loads on the power delivery networks in order to cause voltage regulator circuits 311, 312, 313, and 314 to maintain supply voltages VCC1, VCC2, VCC3, and VCC4, respectively, at substantially constant voltages. Thus, voltage regulator circuit 315 uses a feedback control system to maintain supply voltages VCC1-VCC4 at substantially constant and predetermined voltages over variations in the capacitive loads on the power delivery networks that provide supply voltages VCC1-VCC4. Voltage regulator circuit 315 may additionally set and/or adjust the control signals CS1, CS2, CS3, and CS4 based on input signals from other circuitry in IC die 301 or other IC dies to set and/or adjust supply voltages VCC1-VCC4, respectively.

Figure 4:
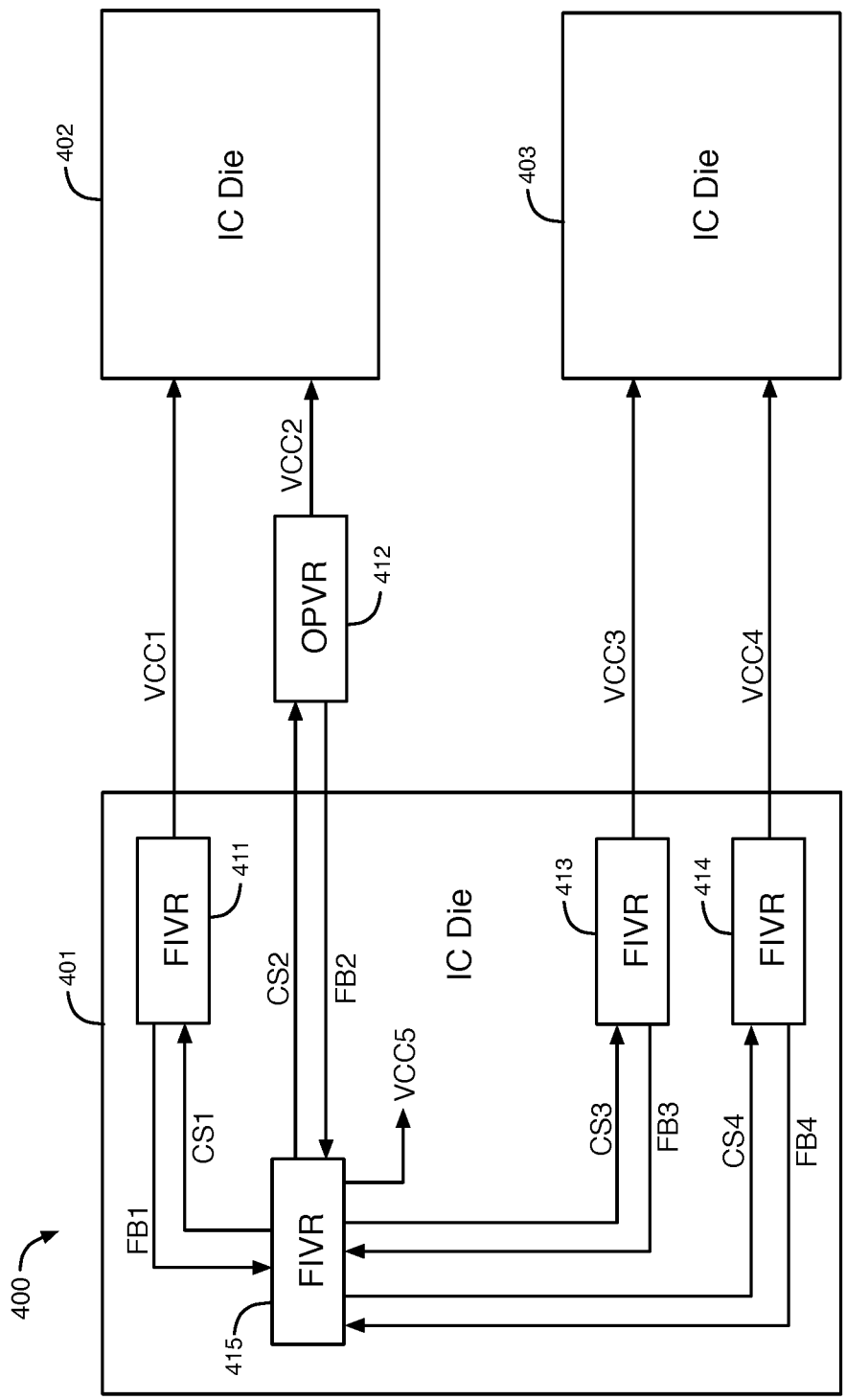
FIG. 4 illustrates another example of a voltage regulation system that generates supply voltages for multiple integrated circuit (IC) dies in a circuit system, according to another embodiment.

FIG. 4 illustrates an example of a voltage regulation system 400 that generates supply voltages for multiple integrated circuit (IC) dies in a circuit system, according to another embodiment. Voltage regulation system 400 includes 3 integrated circuit (IC) dies 401, 402, and 403. The voltage regulation system 400 including the three IC dies 401-403 may, for example, be in a three dimensional (3D) circuit system such as the IC package 100 of FIG. 1. IC dies 401-403 may, for example, be any of the integrated circuit dies 101 and/or 111-115 of FIG. 1. In other embodiments, IC dies 401-403 may be located in another IC package or another type of circuit system. Each of the IC dies 401-403 may be any type of IC die, such as a programmable logic IC (e.g., a field programmable gate array), a microprocessor IC, a GPU IC, a memory IC, an application specific IC, etc.

Voltage regulation system 400 includes 4 fully integrated voltage regulator (FIVR) circuits 411, 413, 414, and 415 and an on-package voltage regulator (OPVR) circuit 412. The OPVR circuit 412 is in an IC package (e.g., IC package 100) that houses circuit system 400. OPVR 412 may, for example, be coupled to or embedded in package substrate 120 or an interposer or interconnection bridge in an IC package. Each of the FIVR circuits 411, 413, 414, and 415 is fully integrated in IC die 401. OPVR circuit 412 may be in a separate IC die.

Five voltage regulator circuits 411-415 are shown in FIG. 4 merely as an example. In other embodiments, voltage regulation system 400 may have any number of voltage regulator circuits that provide supply voltages to any number of IC dies in the system 400 or 100. Voltage regulator circuits 411-415 may be any types of voltage regulators. In some embodiments, voltage regulator circuits 411 and 413-415 may be located in main IC die 101 or in any of the base IC dies 111-115.

Voltage regulator circuits 411, 412, 413, 414, and 415 generate 5 regulated supply voltages VCC1, VCC2, VCC3, VCC4, and VCC5, respectively. Supply voltages VCC1 and VCC2 are provided from voltage regulator circuits 411 and 412 through power delivery networks (that include conductors in the circuit system) to IC die 402. As examples, supply voltages VCC1-VCC2 may be provided to IC die 402 through redistribution layers (RDL) in package substrate 120 and/or through silicon vias (TSVs) in one of the base dies 111-115 to the main IC die 101. Supply voltages VCC1 and VCC2 and supply current from voltage regulator circuits 411-412 are provided through power delivery networks in IC die 402 to circuits (e.g., transistors, resistors, capacitors, and inductors) inside IC die 402.

Supply voltages VCC3 and VCC4 are provided from voltage regulator circuits 413 and 414 through power delivery networks (that include conductors in the circuit system) to IC die 403. As examples, supply voltages VCC3-VCC4 may be provided from IC die 401 to IC die 403 through RDL layers in package substrate 120 and/or TSVs in one of the base dies 111-115 to the main IC die 101. Supply voltages VCC3 and VCC4 and supply current from voltage regulator circuits 413-414 are provided through power delivery networks in IC die 403 to circuits (e.g., transistors, resistors, capacitors, and inductors) inside IC die 403. Voltage regulator circuit 415 generates a fifth supply voltage VCC5 that is provided through a power delivery network in IC die 401 to circuits (e.g., transistors, resistors, capacitors, and inductors) inside IC die 401.

Voltage regulator circuit 415 controls the operation of the voltage regulator circuits 411-414 using 4 feedback loops shown as arrows in FIG. 4. Voltage regulator circuit 415 generates control signals CS1, CS2, CS3, and CS4 that are provided to voltage regulator circuits 411, 412, 413, and 414, respectively. Control signals CS1, CS2, CS3, and CS4 may be, for example, analog input voltages or digital control signals that are used by voltage regulator circuits 411-414 to generate supply voltages VCC1, VCC2, VCC3, and VCC4, respectively, as discussed above with respect to FIG. 2.

Voltage regulator circuits 411, 412, 413, and 414 generate feedback signals FB1, FB2, FB3, and FB4, respectively, that are provided to control inputs of voltage regulator circuit 415. Feedback signals FB1, FB2, FB3, and FB4 may indicate the supply voltages VCC1, VCC2, VCC3, and VCC4 or the supply currents generated by voltage regulator circuits 411, 412, 413, and 414, respectively, at their supply outputs.

Voltage regulator circuit 415 can set the control signals CS1, CS2, CS3, and CS4 based on the feedback signals FB1, FB2, FB3, and FB4 in order to cause the voltage regulator circuits 411, 412, 413, and 414 to set supply voltages VCC1, VCC2, VCC3, and VCC4, respectively, to predetermined voltages. Voltage regulator circuit 415 can adjust control signals CS1, CS2, CS3, and CS4 based on changes in the feedback signals FB1, FB2, FB3, and FB4 that are caused by changes in the capacitive loads on the power delivery networks in order to cause voltage regulator circuits 411-414 to maintain supply voltages VCC1, VCC2, VCC3, and VCC4, respectively, at substantially constant voltages. Thus, voltage regulator circuit 415 uses a feedback control system to maintain supply voltages VCC1-VCC4 at substantially constant and predetermined voltages over variations in the capacitive loads on the power delivery networks that provide supply voltages VCC1-VCC4. Voltage regulator circuit 415 may additionally set and/or adjust the control signals CS1, CS2, CS3, and CS4 based on other input signals to set and/or adjust supply voltages VCC1-VCC4, respectively.

Figure 5:
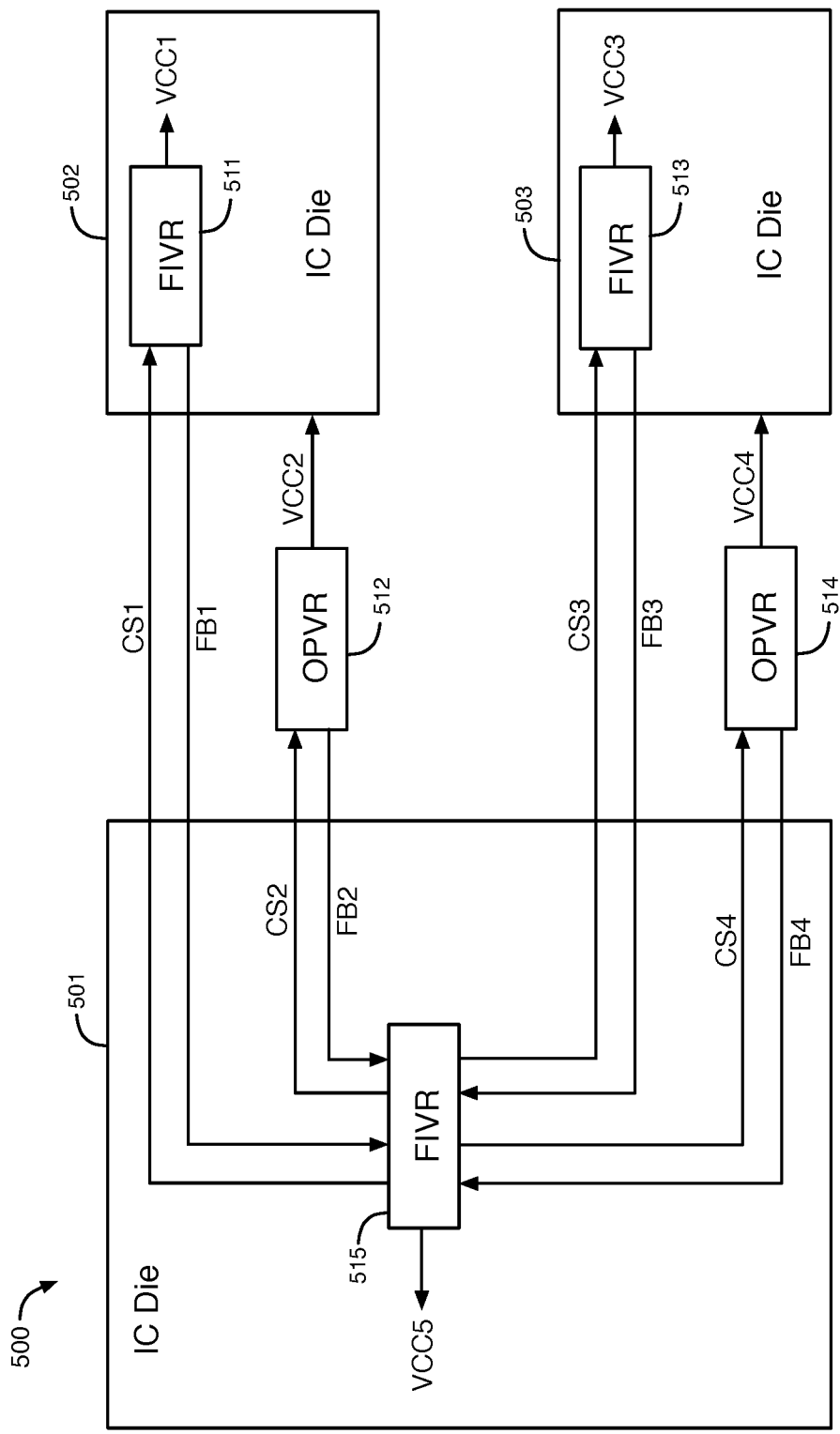
FIG. 5 illustrates another example of a voltage regulation system that generates supply voltages for multiple integrated circuit (IC) dies in a circuit system, according to yet another embodiment.

FIG. 5 illustrates an example of a voltage regulation system 500 that generates supply voltages for multiple integrated circuit (IC) dies in a circuit system, according to yet another embodiment. Voltage regulation system 500 includes 3 integrated circuit (IC) dies 501, 502, and 503. The voltage regulation system 500 including the three IC dies 501-503 may, for example, be in a three dimensional (3D) circuit system such as the IC package 100 of FIG. 1. IC dies 501-503 may be any of the integrated circuits 101 and/or 111-115 of FIG. 1. In other embodiments, IC dies 501-503 may be located in another IC package or another type of circuit system. Each of the IC dies 501-503 may be any type of IC die, such as a programmable logic IC (e.g., a field programmable gate array), a microprocessor IC, a GPU IC, a memory IC, an application specific IC, etc.

Voltage regulation system 500 includes 3 fully integrated voltage regulator (FIVR) circuits 511, 513, and 515 and on-package voltage regulator (OPVR) circuits 512 and 514. The OPVR circuits 512 and 514 are in an IC package (e.g., IC package 100) that houses system 500. OPVR circuits 512 and 514 may, for example, be coupled to or embedded in package substrate 120 or an interposer or interconnection bridge in an IC package. OPVR circuits 512 and 514 may be in separate IC dies. FIVR circuits 511, 513, and 515 are fully integrated in IC dies 502, 503, and 501, respectively.

Voltage regulator circuits 511, 512, 513, 514, and 515 generate 5 regulated supply voltages VCC1, VCC2, VCC3, VCC4, and VCC5, respectively. Supply voltages VCC2 and VCC4 are provided from voltage regulator circuits 512 and 514 through power delivery networks (that include conductors in the circuit system) to IC dies 502 and 503, respectively. Supply voltages VCC2 and VCC4 are provided through power delivery networks in IC dies 502 and 503 to circuits (e.g., transistors, resistors, capacitors, and inductors) in IC dies 502 and 503, respectively. Supply voltages VCC1, VCC3, and VCC5 are provided through power delivery networks in IC dies 502, 503, and 501 to circuits inside IC dies 502, 503, and 501, respectively.

Voltage regulator circuit 515 controls the operation of the voltage regulator circuits 511-514 using 4 feedback loops shown as arrows in FIG. 5. Voltage regulator circuit 515 generates control signals CS1, CS2, CS3, and CS4 that are provided to voltage regulator circuits 511-514, respectively. Control signals CS1, CS2, CS3, and CS4 may be, for example, analog input voltages or digital control signals that are used by voltage regulator circuits 511-514 to generate supply voltages VCC1, VCC2, VCC3, and VCC4, respectively, as discussed above with respect to FIG. 2.

Voltage regulator circuits 511, 512, 513, and 514 generate feedback signals FB1, FB2, FB3, and FB4, respectively, that are provided to control inputs of voltage regulator circuit 515. Feedback signals FB1, FB2, FB3, and FB4 may indicate the supply voltages VCC1, VCC2, VCC3, and VCC4 or the supply currents generated by voltage regulator circuits 511, 512, 513, and 514, respectively, at their supply outputs.

Voltage regulator circuit 515 can set the control signals CS1, CS2, CS3, and CS4 based on the feedback signals FB1, FB2, FB3, and FB4 in order to cause the voltage regulator circuits 511, 512, 513, and 514 to set supply voltages VCC1, VCC2, VCC3, and VCC4, respectively, to predetermined voltages. Voltage regulator circuit 515 can adjust control signals CS1, CS2, CS3, and CS4 based on changes in the feedback signals FB1, FB2, FB3, and FB4 that are caused by changes in the capacitive loads on the power delivery networks in order to cause voltage regulator circuits 511-514 to maintain supply voltages VCC1, VCC2, VCC3, and VCC4, respectively, at substantially constant voltages. Thus, voltage regulator circuit 515 uses a feedback control system to maintain supply voltages VCC1-VCC4 at substantially constant and predetermined voltages over variations in the capacitive loads on the power delivery networks that provide supply voltages VCC1-VCC4. Voltage regulator circuit 515 may additionally set and/or adjust the control signals CS1, CS2, CS3, and CS4 based on other input signals to set and/or adjust supply voltages VCC1-VCC4, respectively.

Figure 6:
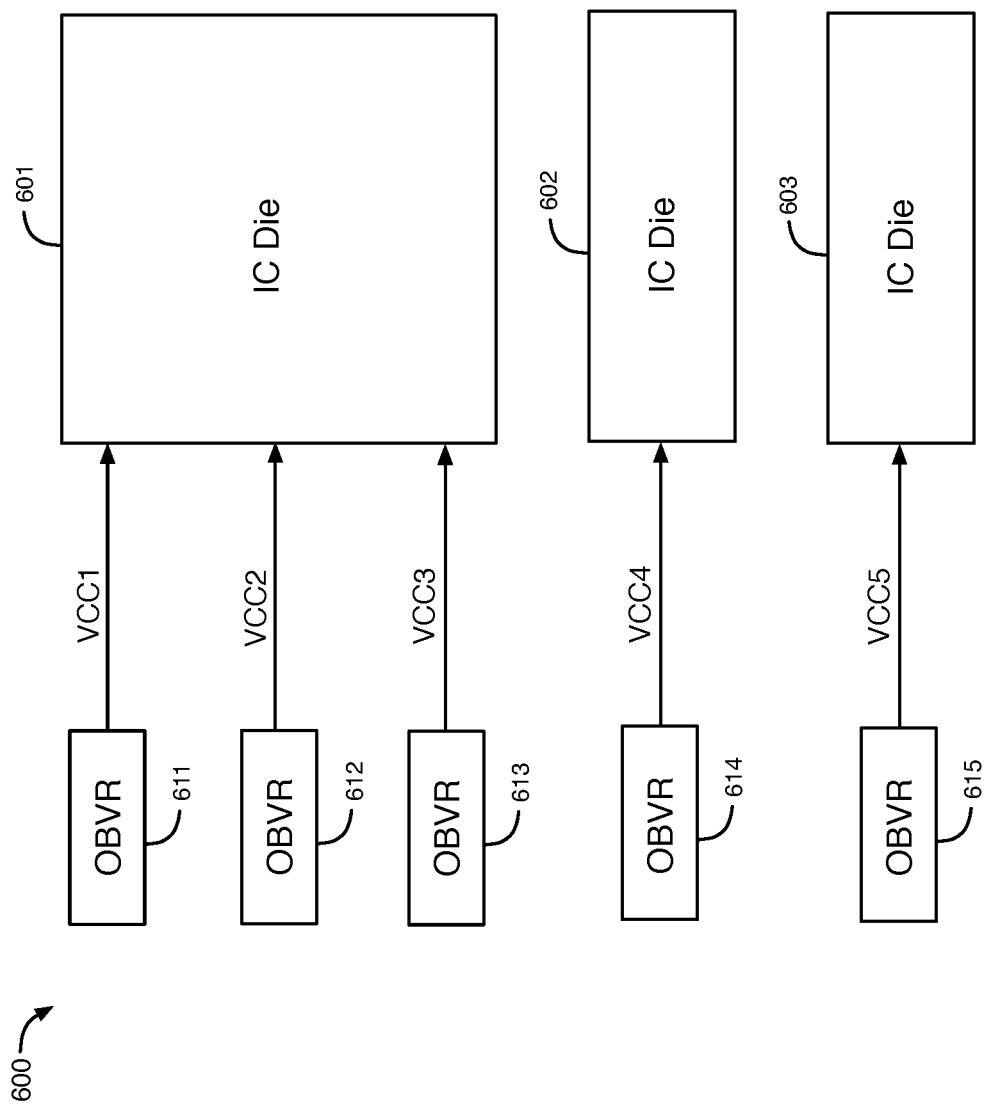
FIG. 6 illustrates another example of a voltage regulation system that generates supply voltages for multiple integrated circuit (IC) dies in a circuit system, according to still another embodiment.

FIG. 6 illustrates an example of a voltage regulation system 600 that generates supply voltages for multiple integrated circuit (IC) dies in a circuit system, according to still another embodiment. Voltage regulation system 600 includes 3 integrated circuit (IC) dies 601, 602, and 603. The voltage regulation system 600 including the three IC dies 601-603 may, for example, be in a three dimensional (3D) circuit system such as the IC package 100 of FIG. 1. IC dies 601-603 may be any of the IC dies 101 and/or 111-115 of FIG. 1. In other embodiments, IC dies 601-603 may be located in another IC package or another type of circuit system. Each of the IC dies 601-603 may be any type of IC die, such as a programmable logic IC (e.g., a field programmable gate array), a microprocessor IC, a GPU IC, a memory IC, etc. According to various embodiments, IC dies 601-603 may be any of IC dies 201-203, 301-303, 401-403, or 501-503.

Voltage regulation system 600 includes 5 on-board voltage regulator (OBVR) circuits 611, 612, 613, 614, and 615. OBVR circuits 611-615 may be in any number of IC dies. The OBVR circuits 611-615 are coupled to a circuit board. For example, OBVR circuits 611-615 may be coupled to a printed circuit board that supports IC package 100. OBVR circuits 611-615 may be coupled to IC package 100 through conductors on the printed circuit board. Voltage regulator circuits 611-615 generate 5 supply voltages VCC1, VCC2, VCC3, VCC4, and VCC5, respectively. Supply voltages VCC1, VCC2, and VCC3 are provided from voltage regulator circuits 611-613, respectively, through power delivery networks (that include conductors on the circuit board and in an IC package) to IC die 601. Supply voltages VCC4 and VCC5 are provided from voltage regulator circuits 614-615 through power delivery networks (that include conductors on the circuit board and in the IC package) to IC dies 602-603, respectively. Supply voltages VCC1-VCC3, VCC4, and VCC5 are provided through power delivery networks in IC dies 601, 602, and 603 to circuits (e.g., transistors, resistors, capacitors, and inductors) in IC dies 601, 602, and 603, respectively.

The following example pertain to further embodiments. Example 1 is a circuit system comprising: a first voltage regulator circuit that generates a first supply voltage for a first integrated circuit die based on a first control signal, wherein the first voltage regulator circuit generates a first feedback signal based on the first supply voltage; a second voltage regulator circuit that generates a second supply voltage for a second integrated circuit die based on a second control signal, wherein the second voltage regulator circuit generates a second feedback signal based on the second supply voltage; and a third voltage regulator circuit that generates the first control signal based on the first feedback signal and the second control signal based on the second feedback signal.

In Example 2, the circuit system of Example 1 may optionally further comprise: a fourth voltage regulator circuit that generates a third supply voltage for the first integrated circuit die based on a third control signal, wherein the fourth voltage regulator circuit generates a third feedback signal based on the third supply voltage, and wherein the third voltage regulator circuit generates the third control signal based on the third feedback signal.

In Example 3, the circuit system of Example 2 may optionally further comprise: a fifth voltage regulator circuit that generates a fourth supply voltage for the second integrated circuit die based on a fourth control signal, wherein the fifth voltage regulator circuit generates a fourth feedback signal based on the fourth supply voltage, and wherein the third voltage regulator circuit generates the fourth control signal based on the fourth feedback signal.

In Example 4, the circuit system of Example 3 may optionally include, wherein the first, second, third, fourth, and fifth voltage regulator circuits are fully integrated voltage regulator circuits in a third integrated circuit die.

In Example 5, the circuit system of Example 3 may optionally include, wherein the first and fourth voltage regulator circuits are in the first integrated circuit die, wherein the second and fifth voltage regulator circuits are in the second integrated circuit die, wherein the third voltage regulator circuit is in a third integrated circuit die, and wherein the circuit system is a three-dimensional circuit system.

In Example 6, the circuit system of Example 3 may optionally include, wherein the first, second, third, and fifth voltage regulator circuits are fully integrated voltage regulator circuits in a third integrated circuit die, and wherein the fourth voltage regulator circuit is an on-package voltage regulator circuit in an integrated circuit package that houses the first, second, and third integrated circuit dies.

In Example 7, the circuit system of Example 3 may optionally include, wherein the first voltage regulator circuit is in the first integrated circuit die, wherein the second voltage regulator circuit is in the second integrated circuit die, wherein the third voltage regulator circuit is in a third integrated circuit die, wherein the fourth voltage regulator circuit is a first on-package voltage regulator circuit in an integrated circuit package that houses the first, second, and third integrated circuit dies, and wherein the fifth voltage regulator circuit is a second on-package voltage regulator circuit in the integrated circuit package.

In Example 8, the circuit system of any one of Examples 1-7 may optionally include, wherein the third voltage regulator circuit varies the first and second control signals independently and on demand based on the first feedback signal indicating a capacitive load in the first integrated circuit die that receives the first supply voltage and based on the second feedback signal indicating a capacitive load in the second integrated circuit die that receives the second supply voltage.

Example 9 is a voltage regulation system comprising: a first voltage regulator circuit that generates a first supply voltage for a first integrated circuit die based on a first control signal, wherein the first voltage regulator circuit generates a first feedback signal based on the first supply voltage; a second voltage regulator circuit that generates a second supply voltage for the first integrated circuit die based on a second control signal, wherein the second voltage regulator circuit generates a second feedback signal based on the second supply voltage; and a third voltage regulator circuit that generates the first control signal based on the first feedback signal and the second control signal based on the second feedback signal.

In Example 10, the voltage regulation system of Example 9 may optionally further comprise: a fourth voltage regulator circuit that generates a third supply voltage for a second integrated circuit die based on a third control signal, wherein the fourth voltage regulator circuit generates a third feedback signal based on the third supply voltage, and wherein the third voltage regulator circuit generates the third control signal based on the third feedback signal.

In Example 11, the voltage regulation system of Example 10 may optionally further comprise: a fifth voltage regulator circuit that generates a fourth supply voltage for the second integrated circuit die based on a fourth control signal, wherein the fifth voltage regulator circuit generates a fourth feedback signal based on the fourth supply voltage, and wherein the third voltage regulator circuit generates the fourth control signal based on the fourth feedback signal.

In Example 12, the voltage regulation system of Example 11 may optionally include, wherein the first, second, third, fourth, and fifth voltage regulator circuits are fully integrated voltage regulator circuits in a third integrated circuit die.

In Example 13, the voltage regulation system of Example 11 may optionally include, wherein the first and second voltage regulator circuits are in the first integrated circuit die, wherein the fourth and fifth voltage regulator circuits are in the second integrated circuit die, and wherein the third voltage regulator circuit is in a third integrated circuit die.

In Example 14, the voltage regulation system of Example 11 may optionally include, wherein the first, third, fourth, and fifth voltage regulator circuits are fully integrated voltage regulator circuits in a third integrated circuit die, and wherein the second voltage regulator circuit is an on-package voltage regulator circuit in an integrated circuit package that houses the first, second, and third integrated circuit dies.

In Example 15, the voltage regulation system of Example 11 may optionally include, wherein the first voltage regulator circuit is in the first integrated circuit die, wherein the third voltage regulator circuit is in a third integrated circuit die, wherein the second voltage regulator circuit is a first on-package voltage regulator circuit in an integrated circuit package that houses the first, second, and third integrated circuit dies, wherein the fourth voltage regulator circuit is in the second integrated circuit die, and wherein the fifth voltage regulator circuit is a second on-package voltage regulator circuit in the integrated circuit package.

Example 16 is a method for providing regulated supply voltages in a circuit system, the method comprising: generating a first supply voltage that is provided to a first integrated circuit die based on a first control signal using a first voltage regulator circuit; generating a first feedback signal based on the first supply voltage using the first voltage regulator circuit; generating a second supply voltage that is provided to a second integrated circuit die based on a second control signal using a second voltage regulator circuit; generating a second feedback signal based on the second supply voltage using the second voltage regulator circuit; generating the first control signal based on the first feedback signal using a third voltage regulator circuit; and generating the second control signal based on the second feedback signal using the third voltage regulator circuit.

In Example 17, the method of Example 16 may optionally further comprise: generating a third supply voltage that is provided to the first integrated circuit die based on a third control signal using a fourth voltage regulator circuit; generating a third feedback signal based on the third supply voltage using the fourth voltage regulator circuit; and generating the third control signal based on the third feedback signal using the third voltage regulator circuit.

In Example 18, the method of Example 17 may optionally further comprise: generating a fourth supply voltage that is provided to the second integrated circuit die based on a fourth control signal using a fifth voltage regulator circuit; generating a fourth feedback signal based on the fourth supply voltage using the fifth voltage regulator circuit; and generating the fourth control signal based on the fourth feedback signal using the third voltage regulator circuit.

In Example 19, the method of Example 18 may optionally include, wherein the first, second, third, fourth, and fifth voltage regulator circuits are fully integrated voltage regulator circuits in a third integrated circuit die.

In Example 20, the method of Example 18 may optionally include, wherein the first and fourth voltage regulator circuits are in the first integrated circuit die, wherein the second and fifth voltage regulator circuits are in the second integrated circuit die, and wherein the third voltage regulator circuit is in a third integrated circuit die.

In Example 21, the method of any one of Examples 16-20 may optionally include, wherein the first voltage regulator circuit and the second voltage regulator circuit are fully integrated voltage regulators in a field programmable gate array, and wherein the method further comprises: physically organizing user logic in the field programmable gate array using timing criticality to control the fully integrated voltage regulators through soft logic for power reduction.

In Example 22, the method of any one of Examples 16-21 may optionally further comprise: determining a number or sizes of voltage regulators that provide supply voltages to each of the first and second integrated circuit dies based on capacitive loads of the first and second integrated circuit dies.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. A circuit system comprising:
   a first voltage regulator circuit that generates a first supply voltage for a first integrated circuit die based on a first control signal, wherein the first voltage regulator circuit generates a first feedback signal based on the first supply voltage;
   a second voltage regulator circuit that generates a second supply voltage for a second integrated circuit die based on a second control signal, wherein the second voltage regulator circuit generates a second feedback signal based on the second supply voltage; and
   a third voltage regulator circuit that generates the first control signal based on the first feedback signal and the second control signal based on the second feedback signal.

2. The circuit system of claim 1 further comprising:
   a fourth voltage regulator circuit that generates a third supply voltage for the first integrated circuit die based on a third control signal, wherein the fourth voltage regulator circuit generates a third feedback signal based on the third supply voltage, and wherein the third voltage regulator circuit generates the third control signal based on the third feedback signal.

3. The circuit system of claim 2 further comprising:
   a fifth voltage regulator circuit that generates a fourth supply voltage for the second integrated circuit die based on a fourth control signal, wherein the fifth voltage regulator circuit generates a fourth feedback signal based on the fourth supply voltage, and wherein the third voltage regulator circuit generates the fourth control signal based on the fourth feedback signal.

4. The circuit system of claim 3, wherein the first, second, third, fourth, and fifth voltage regulator circuits are fully integrated voltage regulator circuits in a third integrated circuit die.

5. The circuit system of claim 3, wherein the first and fourth voltage regulator circuits are in the first integrated circuit die, wherein the second and fifth voltage regulator circuits are in the second integrated circuit die, wherein the third voltage regulator circuit is in a third integrated circuit die, and wherein the circuit system is a three-dimensional circuit system.

6. The circuit system of claim 3, wherein the first, second, third, and fifth voltage regulator circuits are fully integrated voltage regulator circuits in a third integrated circuit die, and wherein the fourth voltage regulator circuit is an on-package voltage regulator circuit in an integrated circuit package that houses the first, second, and third integrated circuit dies.

7. The circuit system of claim 3, wherein the first voltage regulator circuit is in the first integrated circuit die, wherein the second voltage regulator circuit is in the second integrated circuit die, wherein the third voltage regulator circuit is in a third integrated circuit die, wherein the fourth voltage regulator circuit is a first on-package voltage regulator circuit in an integrated circuit package that houses the first, second, and third integrated circuit dies, and wherein the fifth voltage regulator circuit is a second on-package voltage regulator circuit in the integrated circuit package.

8. The circuit system of claim 1, wherein the third voltage regulator circuit varies the first and second control signals independently and on demand based on the first feedback signal indicating a capacitive load in the first integrated circuit die that receives the first supply voltage and based on the second feedback signal indicating a capacitive load in the second integrated circuit die that receives the second supply voltage.

9. A voltage regulation system comprising:
a first voltage regulator circuit that generates a first supply voltage for a first integrated circuit die based on a first control signal, wherein the first voltage regulator circuit generates a first feedback signal based on the first supply voltage;
a second voltage regulator circuit that generates a second supply voltage for the first integrated circuit die based on a second control signal, wherein the second voltage regulator circuit generates a second feedback signal based on the second supply voltage; and
a third voltage regulator circuit that generates the first control signal based on the first feedback signal and the second control signal based on the second feedback signal.

10. The voltage regulation system of claim 9 further comprising:
a fourth voltage regulator circuit that generates a third supply voltage for a second integrated circuit die based on a third control signal, wherein the fourth voltage regulator circuit generates a third feedback signal based on the third supply voltage, and wherein the third voltage regulator circuit generates the third control signal based on the third feedback signal.

11. The voltage regulation system of claim 10 further comprising:
a fifth voltage regulator circuit that generates a fourth supply voltage for the second integrated circuit die based on a fourth control signal, wherein the fifth voltage regulator circuit generates a fourth feedback signal based on the fourth supply voltage, and wherein the third voltage regulator circuit generates the fourth control signal based on the fourth feedback signal.

12. The voltage regulation system of claim 11, wherein the first, second, third, fourth, and fifth voltage regulator circuits are fully integrated voltage regulator circuits in a third integrated circuit die.

13. The voltage regulation system of claim 11, wherein the first and second voltage regulator circuits are in the first integrated circuit die, wherein the fourth and fifth voltage regulator circuits are in the second integrated circuit die, and wherein the third voltage regulator circuit is in a third integrated circuit die.

14. The voltage regulation system of claim 11, wherein the first, third, fourth, and fifth voltage regulator circuits are fully integrated voltage regulator circuits in a third integrated circuit die, and wherein the second voltage regulator circuit is an on-package voltage regulator circuit in an integrated circuit package that houses the first, second, and third integrated circuit dies.

15. The voltage regulation system of claim 11, wherein the first voltage regulator circuit is in the first integrated circuit die, wherein the third voltage regulator circuit is in a third integrated circuit die, wherein the second voltage regulator circuit is a first on-package voltage regulator circuit in an integrated circuit package that houses the first, second, and third integrated circuit dies, wherein the fourth voltage regulator circuit is in the second integrated circuit die, and wherein the fifth voltage regulator circuit is a second on-package voltage regulator circuit in the integrated circuit package.

16. A method for providing regulated supply voltages in a circuit system, the method comprising:
generating a first supply voltage that is provided to a first integrated circuit die based on a first control signal using a first voltage regulator circuit;
generating a first feedback signal based on the first supply voltage using the first voltage regulator circuit;
generating a second supply voltage that is provided to a second integrated circuit die based on a second control signal using a second voltage regulator circuit;
generating a second feedback signal based on the second supply voltage using the second voltage regulator circuit;
generating the first control signal based on the first feedback signal using a third voltage regulator circuit; and
generating the second control signal based on the second feedback signal using the third voltage regulator circuit.

17. The method of claim 16 further comprising:
generating a third supply voltage that is provided to the first integrated circuit die based on a third control signal using a fourth voltage regulator circuit;
generating a third feedback signal based on the third supply voltage using the fourth voltage regulator circuit; and
generating the third control signal based on the third feedback signal using the third voltage regulator circuit.

18. The method of claim 17 further comprising:
generating a fourth supply voltage that is provided to the second integrated circuit die based on a fourth control signal using a fifth voltage regulator circuit;
generating a fourth feedback signal based on the fourth supply voltage using the fifth voltage regulator circuit; and
generating the fourth control signal based on the fourth feedback signal using the third voltage regulator circuit.

19. The method of claim 18, wherein the first, second, third, fourth, and fifth voltage regulator circuits are fully integrated voltage regulator circuits in a third integrated circuit die.

20. The method of claim 18, wherein the first and fourth voltage regulator circuits are in the first integrated circuit die, wherein the second and fifth voltage regulator circuits are in the second integrated circuit die, and wherein the third voltage regulator circuit is in a third integrated circuit die.

21. The method of claim 16, wherein the first voltage regulator circuit and the second voltage regulator circuit are fully integrated voltage regulators in a field programmable gate array, and wherein the method further comprises:
physically organizing user logic in the field programmable gate array using timing criticality to control the fully integrated voltage regulators through soft logic for power reduction.

22. The method of claim 16 further comprising:
determining a number or sizes of voltage regulators that provide supply voltages to each of the first and second integrated circuit dies based on capacitive loads of the first and second integrated circuit dies.

* * * * *